United States Patent
Eberhardt et al.

(10) Patent No.: US 10,297,729 B2
(45) Date of Patent: May 21, 2019

(54) OPTOELECTRONICS SEMICONDUCTOR COMPONENT

(71) Applicant: OSRAM GMBH, Munich (DE)

(72) Inventors: Angela Eberhardt, Augsburg (DE); Christina Wille, Friedberg (DE); Florian Peskoller, Ingolstadt (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 14/408,221

(22) PCT Filed: Jun. 14, 2013

(86) PCT No.: PCT/EP2013/062384
§ 371 (c)(1),
(2) Date: Dec. 15, 2014

(87) PCT Pub. No.: WO2013/186365
PCT Pub. Date: Dec. 19, 2013

(65) Prior Publication Data
US 2015/0123156 A1  May 7, 2015

(30) Foreign Application Priority Data

Jun. 15, 2012 (DE) .................. 10 2012 210 083

(51) Int. Cl.
*H01L 33/50* (2010.01)
*H01L 33/48* (2010.01)
(Continued)

(52) U.S. Cl.
CPC .......... *H01L 33/504* (2013.01); *H01L 33/483* (2013.01); *H01L 33/501* (2013.01);
(Continued)

(58) Field of Classification Search
USPC .......................................... 257/98
See application file for complete search history.

(56) References Cited

U.S. PATENT DOCUMENTS 2,697,668 A    12/1954  Erwin et al.
4,276,363 A     6/1981  Manabe et al.
(Continued)

FOREIGN PATENT DOCUMENTS

CN    1561549    1/2005
CN    1636259    7/2005
(Continued)

*Primary Examiner* — Marcos D. Pizarro
*Assistant Examiner* — Lawrence C Tynes, Jr.
(74) *Attorney, Agent, or Firm* — Cozen O'Connor

(57) ABSTRACT

An optoelectronic semiconductor component having a light source, which emits primary radiation, a housing, and electrical terminals, wherein a conversion element, which is based on a matrix and at least two phosphors, is connected upstream of the optoelectronic semiconductor component. The matrix contains metal phosphate and preferably consists of metal phosphate. The phosphors partially or completely convert primary radiation. At least one first phosphor powder is embedded and fixed in a first inorganic matrix based on a metal phosphate, and at least one second phosphor powder is embedded and fixed in a second matrix based on a metal phosphate.

20 Claims, 2 Drawing Sheets

(51) Int. Cl.
  *H01L 33/62*    (2010.01)
  *H01L 33/64*    (2010.01)
  *H05B 33/14*    (2006.01)

(52) U.S. Cl.
  CPC .......... *H01L 33/508* (2013.01); *H01L 33/62* (2013.01); *H01L 33/64* (2013.01); *H05B 33/14* (2013.01); *H01L 33/507* (2013.01); *H01L 2224/48091* (2013.01); *H01L 2224/48247* (2013.01)

(56) References Cited

U.S. PATENT DOCUMENTS

| | | | |
|---|---|---|---|
| 4,490,286 A * | 12/1984 | Volynets | G03C 1/725 |
| | | | 252/301.4 F |
| 5,965,469 A | 10/1999 | Kilgo et al. | |
| 2007/0155881 A1 * | 7/2007 | Hirthe | C08K 3/32 |
| | | | 524/398 |
| 2009/0064893 A1 * | 3/2009 | Sambasivan | C23C 4/134 |
| | | | 106/14.05 |
| 2011/0220919 A1 * | 9/2011 | Okada | C09K 11/7734 |
| | | | 257/88 |
| 2012/0018761 A1 * | 1/2012 | Honda | H05B 33/10 |
| | | | 257/98 |

FOREIGN PATENT DOCUMENTS

| | | |
|---|---|---|
| CN | 1647241 | 7/2005 |
| CN | 1874019 | 12/2006 |
| CN | 101755345 | 6/2010 |
| CN | 102191058 | 9/2011 |
| DE | 10118630 | 10/2002 |
| DE | 10159544 | 6/2003 |
| DE | 102010028776 | 11/2011 |
| DE | 102012210195 | 12/2013 |
| EP | 0139997 A2 | 5/1985 |
| JP | 2008-034546 | 2/2008 |
| JP | 2011-168627 | 9/2011 |
| JP | 2013-525259 | 6/2013 |
| JP | 2013-539238 | 10/2013 |
| WO | WO 03/090251 | 10/2003 |
| WO | WO 2011/138169 | 11/2011 |
| WO | WO 2012/045772 | 4/2012 |

* cited by examiner

OPTOELECTRONICS SEMICONDUCTOR COMPONENT

RELATED APPLICATION

This is a U.S. National Phase Application under 35 USC 371 of International Application PCT/EP2013/062384 filed on Jun. 14, 2013.

This application claims the priority of German application no. 10 2012 210 083.0 filed Jun. 15, 2012, the entire content of which is hereby incorporated by reference.

FIELD OF THE INVENTION

The invention is related to an optoelectronic semiconductor component.

BACKGROUND OF THE INVENTION

DE-A 10 11 8630 and DE-A 10 15 9544 disclose LEDs having glass parts. U.S. Pat. No. 5,965,469 discloses a phosphate glass which is used as an adhesive.

DE-Az 10 2010 028 776.8 discloses metal phosphates as a matrix for conversion elements, wherein multiple phosphors can also be contained in one layer.

SUMMARY OF THE INVENTION

One object of the invention is to provide a particularly efficient, temperature-resistant, and weather-resistant solution for a conversion element having at least two phosphors in an optoelectronic semiconductor component.

This and other objects are attained in accordance with one aspect of the present invention directed to an optoelectronic semiconductor component having a light source, which emits primary radiation, a housing, and electrical terminals. A conversion element, which is based on a matrix and at least two phosphors, is connected upstream of the optoelectronic semiconductor component. The matrix contains metal phosphate and preferably consists of metal phosphate. The phosphors partially or completely convert primary radiation. At least one first phosphor powder is embedded and fixed in a first inorganic matrix based on a metal phosphate, and at least one second phosphor powder is embedded and fixed in a second matrix based on a metal phosphate.

Organic components as the matrix enclosing the phosphor typically have a poor thermal conductivity and are temperature sensitive. For CLC conversion, silicone is often used, which generally withstands a continuous load of approximately 160° C. and a short-term load (a few seconds) of approximately 300° C. The temperature stability of polycarbonate, which is often used as a matrix for remote applications, is rather still lower and possibly results in deformations. Since the LEDs are always increasing in power, these temperature resistances are soon no longer sufficient. To prevent the efficiency from decreasing in the event of high load, as a result of discoloration of the matrix or damage to the phosphor due to the inadequate heat dissipation, other matrix materials are required. These are known to be inorganic materials such as glass, ceramic, or a mixture thereof. The efficiency of the LED can simultaneously be improved still further by reducing the remission. This is solved by not providing the various phosphors as a mixture in a matrix, but rather separately from one another.

According to an embodiment of the invention, this is achieved by using at least one metal phosphate as a matrix for at least one phosphor, or using different components made of metal phosphate. A further conversion element, which consists of the same or a different metal phosphate matrix or different components made of metal phosphate, in which another phosphor is embedded, directly adjoins above or adjacent to this conversion element. The remission is thus reduced and simultaneously improved thermal conductivity and better temperature resistance and weather resistance of the conversion element are achieved. The metal phosphate matrix is formed by condensation (chemical setting) of a metal phosphate solution. The cross-linking progresses more and more with increasing temperature, whereby the viscosity of the metal phosphate matrix increases. The phosphor powder added to the metal phosphate solution is already wetted thereby at room temperature and then enclosed by the condensing matrix upon temperature increase. In contrast thereto, a metal phosphate glass, which was melted via a batch, must first be softened enough by rising temperatures so that it has sufficiently low viscosity to wet and enclose the phosphor powder. With comparable composition, this generally requires significantly higher temperatures than embedding via the condensation of a metal phosphate solution and can already damage the phosphor, in particular nitridic phosphors, which usually already significantly lose efficiency at temperatures greater than 350° C. The term metal phosphate therefore stands in the further course of the text for the condensing or condensed matrix or the starting solution thereof.

The metal phosphate is preferably lead-free. In a special embodiment, the condensed metal phosphate is also colorless and amorphous or predominantly amorphous, transparent in UV-VIS, and essentially also alkali-free and halogen-free. Additionally the condensed matrix ideally also has few bubbles. Amorphous or predominantly amorphous means that the matrix itself has no or at most 25 vol.-%, ideally at most 10 vol.-% crystalline phase components. The embedded crystalline phosphor powder is excepted therefrom.

Additives and/or radiation-absorbing elements and/or components which change the index of refraction can be added to the metal phosphate. These components are preferably inorganic. The metal phosphate can be, for example, aluminum phosphate, yttrium phosphate, alkaline earth phosphate, phosphates of the third main group and the secondary groups or also other rare earth phosphates or mixtures thereof. In particular also additives, for example, $SiO_2$, for example, in the form of Aerosil, pyrogenic $Al_2O_3$ or $TiO_2$, etc. can be added to the phosphate. These additives are preferably added as nanopowders, in particular the mean particle size thereof is established in the range of 1 to 40 nm. Ground glasses, for example, hard glasses or ground glass solder, can also be added. These additives can optionally further increase the thermal conductivity, can be used as reflectors or scattering agents, or can also adapt the thermal coefficients of expansion. However, only additives which absorb no or no substantial components of radiation are preferably used, since this would reduce the efficiency.

Further components are used in a targeted manner to change the index of refraction, in particular compounds containing tellurium or bismuth. The condensed metal phosphate is inorganic, optically stable, and moisture-resistant, and is preferably produced at low temperatures. This metal phosphate is therefore suitable for embedding phosphors, i.e., as a matrix for a conversion element. The component of additives can be sufficiently high that the condensed metal phosphate is predominantly used as a binder.

The application of conversion elements having such metal phosphates results in increased efficiency and lengthened service life. At least one component made of metal phosphate is preferably used for this purpose, optionally having additives which are scattering or change the index of refraction. An increase of the thermal conductivity, an improvement of the temperature stability, and optionally an increased index of refraction are thus achieved. An ideal adaptation as a matrix for the phosphor embedded therein may thus be achieved. The phosphor can be applied with such a matrix directly onto various underlays (chip, glass, ceramic, diverse metals, inter alia), without using an additional adhesive, which represents an advantage over conversion ceramics, which are also temperature-resistant and weather-resistant and have good thermal conductivity.

A part or also all added components can be selected such that they chemically react with the metal phosphate and thus modify it.

BRIEF DESCRIPTION OF THE DRAWINGS

The invention will be explained in greater detail hereafter on the basis of several exemplary embodiments. In the figures.

DETAILED DESCRIPTION OF THE DRAWINGS

Figure 1:
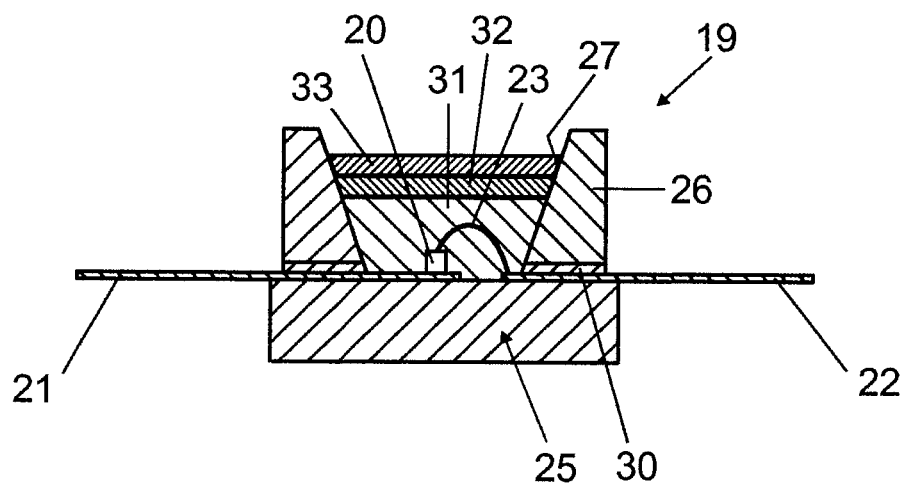
FIG. 1 shows an LED having vertically coated conversion element.

FIG. 1 shows an optoelectronic semiconductor component 19 in section. The core part is a chip 20, which primarily emits in UV, and which is connected to electrical terminals 21, 22, which are implemented as conductor frame parts. One of the parts is connected via a bond wire 23 to the chip. The chip 20 is seated directly on a broad first terminal 21, which is arranged on the surface of a rectangular base body or substrate 25 made of glass (preferably quartz glass, hard glass, soft glass, or glass solder) or made of ceramic. A ring-shaped attachment 26, which leaves a recess free in its interior, is placed on the base body. The inner inclined wall 27 of the attachment is shaped as a reflector. The attachment is bonded to the base body and the conductor frame, which is formed by the terminals, by an adhesive 30. The attachment 26 is also manufactured from glass.

The recess inside the reflector has a conversion element. For this purpose, the recess is filled with a first layer 31 based on a matrix made of metal phosphate 31, which encloses a first converting phosphor. A second layer 32 and a third layer 33 based on a metal phosphate are arranged above the first layer, which respectively contain second and third phosphors.

The LED is in particular terminated using a cover plate (not shown) and therefore hermetically sealed. A metal phosphate which contains at most 1 mol-% of oxides of alkali and halogen elements is preferably used. The conversion element has, generally speaking, a thin layer in each case, which has condensed metal phosphate as a matrix. One or more phosphors are embedded therein, as known per se. Typical phosphors are YAG:Ce, sions, nitrides, or also orthosilicates or calsins. They are used in particular for generating white light with the aid of a blue-emitting or UV-emitting chip. In a special embodiment, the phosphor particles are only glued to one another (gluing) by the condensed metal phosphate or enclosed thereby (protective layer). In the latter case, the phosphor particles thus passivated can also be provided in another condensed metal phosphate matrix.

Figure 2:
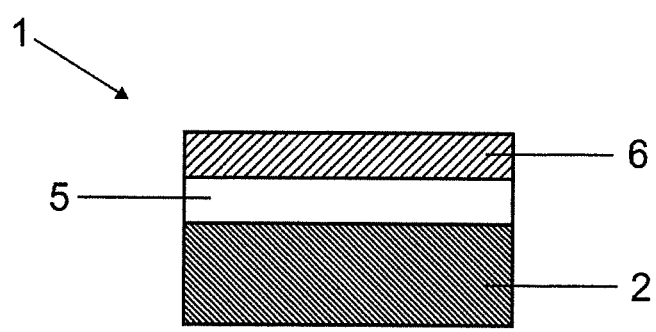
FIG. 2 shows a further exemplary embodiment of an LED having vertically coated conversion element.

According to FIG. 2, the conversion element can be applied as a so-called thin-film element directly onto the chip 2. In this case, a first layer 5 of a metal phosphate, in which the red-emitting nitride of the type M2Si5N8:Eu is embedded, is applied directly onto the chip 2. A second layer 6, which follows the first layer, has a similar matrix of this metal phosphate and a green-emitting garnet A3B5O12:Eu is embedded therein as a phosphor. A is preferably Y or Lu alone or in combination, B is preferably Al or Ga alone or in combination.

The metal phosphate is alkali-poor and halogen-poor. It is preferably alkali-free and halogen-free. This means that these elements are not intentionally added and at most originate from contaminants of the precursor materials used. The concentrations of alkali metals and halogens are therefore insignificant and are each less than 1 mol-%. Components subjected to ions are thus reduced or entirely avoided. This applies in particular to ion-forming elements such as Na, Cl, K, and F. Specifically, these can enter the LED in the event of moisture, thus attack the contacts, and also impair the charge density on the chip.

Figure 3:
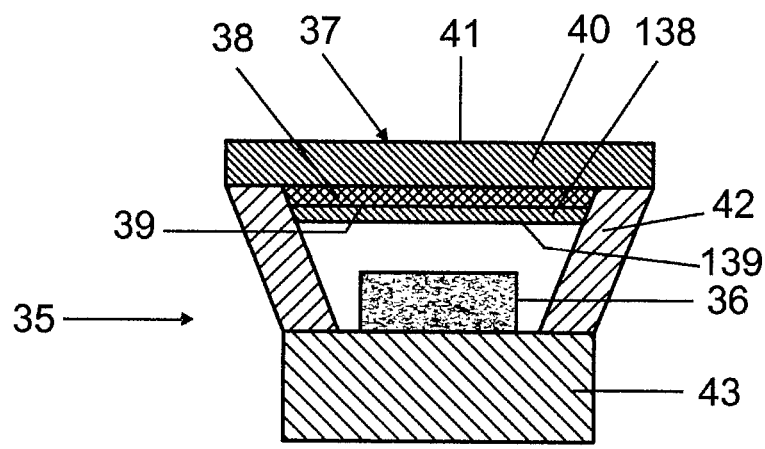
FIG. 3 shows a further exemplary embodiment of an LED having vertically coated conversion element.

FIG. 3 shows an optoelectronic semiconductor component 35 having conversion element 37, which is spaced apart from the chip 36, made of two layers according to the remote phosphor concept. The first phosphor 38 (schematic) is embedded here in a first metal phosphate matrix 39 as the first layer or enclosed thereby. The second phosphor 138 (schematic) is embedded here in a second metal phosphate matrix 139 as the second layer or enclosed thereby. Both matrices are adapted to the respective phosphor. The matrix materials thereof are therefore different from one another, for example, with regard to the content of Al2O3 or a possible addition of Y2O3.

The conversion element 37 additionally has a substrate 40. The phosphors 38 and 138 are preferably arranged facing toward the chip 36 and therefore in the beam direction in front of the substrate. The substrate 40 is transparent, for example, a glass. The conversion element 37, consisting of conversion layers and substrate, preferably homogenizes the emission of the secondary radiation. The phosphor-free side 41 of the substrate can be additionally roughened for this purpose.

In addition, the phosphors 38 and/or 138 can be inhomogeneously applied intentionally in the horizontal direction, so that a good color homogeneity is ensured over all angles and the phosphor is optimally utilized. The remote phosphor solution described here is also applicable when the radiation of multiple chips is to be converted jointly. In the latter case, phosphor-free points can also be provided on the substrate.

Figure 4:
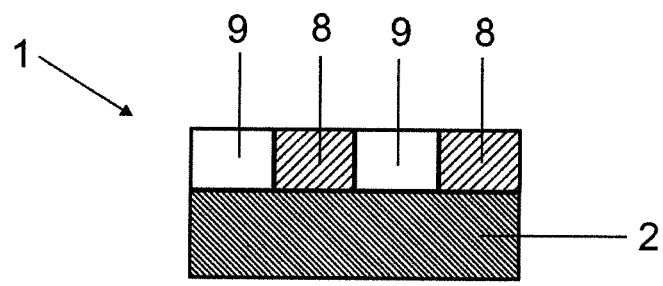
FIG. 4 shows an exemplary embodiment of an LED having horizontally coated conversion element.
Figure 5:
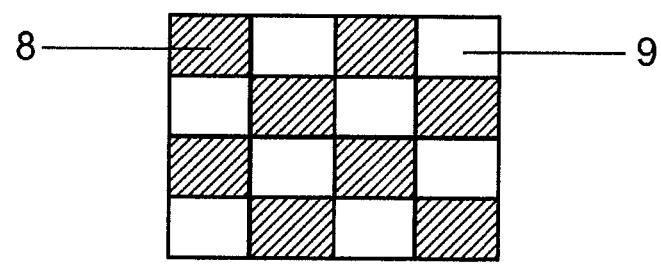
FIG. 5 shows a further exemplary embodiment of a semiconductor component in a top view.

FIG. 4 shows a further exemplary embodiment of an LED with horizontal coating of the conversion element. In this case, the conversion element is applied directly to the chip 2. It has at least two and preferably up to four different strips of layers. A first type of layer 8 is a metal phosphate, to which a nitride is admixed as a phosphor. A second type of layer 9 is a metal phosphate, to which a garnet is admixed as a phosphor. The horizontal arrangement can be in strips or can also be similar to a chessboard, like a lattice, see FIG. 5 in a top view, or also in lozenges like a collapsible fence.

The production of such metal phosphates is performed via the known sol-gel method from a soluble metal phosphate or from the reaction product of an alkoxide with phosphoric acid or from the reaction product of metal salt or metal hydroxide with phosphoric acid. The solvent is firstly removed by drying. Water or carbonaceous components are cleaved off by a subsequent treatment at higher temperatures and the metal phosphate is then provided in polymerized form. Aluminum, yttrium, or also one of the metal phosphates mentioned at the outset of the other rare earth phosphates is preferably used, because such phosphates have a high temperature resistance and good moisture resistance. If phosphor is embedded, it is important that it is not damaged by a chemical reaction with the solution or the resulting reaction products or by excessively high temperatures.

The metal phosphate can be provided in amorphous, partially crystalline, or crystalline form. It is preferably predominantly amorphous.

The proposed system made of at least two layers of condensed metal phosphate is used in this case as an inorganic matrix of a conversion element, in which the powder of at least one phosphor is embedded in each case, in particular directly on the chip or as a remote phosphor concept. The condensed metal phosphate matrix is preferably colorless and amorphous or predominantly amorphous, having good transmission in the UV range up to the visible spectral range.

The conversion element proposed here made of at least two layers having a matrix made of condensed metal phosphate reduces the remission and also enables simpler process control due to separate processing of different phosphor types. At the same time, it has improved temperature resistance and weather resistance, improved heat dissipation, and is resistant in UV. It is therefore suitable as a conversion element for an LED (CLC and remote) and results in an increase in efficiency and/or lengthening of the service life because of the better properties.

As mentioned at the outset, currently conversion elements for LEDs are usually produced using organic components, for example, silicone, in which phosphor powders are embedded. These organic components have poor thermal conductivity and are additionally relatively temperature-sensitive. This results in a lower efficiency of the LED when the matrix materials discolor due to excessively high temperatures or the phosphor is damaged due to excessively high temperatures. The heat generated by the Stokes shift, which must be dissipated from the phosphor via the matrix, largely contributes to the temperature increase. To achieve a specific colorimetric locus, heretofore powders of various phosphor types were generally mixed homogeneously with one another, for example, in a silicone matrix. During the conversion, this results in a specific remission. The latter can be reduced if conversion ceramics having various light colors are used. However, it is disadvantageous that they must be glued to one another. Furthermore, separate gluing on the chip, substrate, or housing is also necessary.

If condensed metal phosphate is used as the matrix, it is possible to combine the advantages of better heat dissipation, lower remission, and direct bonding, i.e., to apply the various phosphor types, for example, red-emitting and yellow-emitting (with respect to the peak emission), separately from one another, whereby the remission is decreased. This is possible in multiple layers in the vertical or horizontal direction, for example. Gluing is not necessary, since one layer can be applied directly to another or to the substrate, and the bonding is thus performed automatically via the condensing metal phosphate matrix. For this purpose, a substrate, e.g., the chip, a glass, a ceramic, or a metal is coated using a suspension made of the matrix solution and a phosphor powder contained therein, for example, YAG:Ce, and then dried. The matrix is then condensed at higher temperatures, of typically 200 to 550° C. Depending on the matrix composition, the water cleavage takes place at least partially up to completely at this time. The cleavage of possibly occurring carbonaceous reaction products is generally completed. In the next step, the coating using a second, similar or different matrix solution and a second phosphor powder, for example, a nitride corresponding to the first coating is performed. Because of the temperature sensitivity of these phosphors, a temperature of 350° C. should not be exceeded if possible for the condensation of this matrix. An upper temperature limit for the condensation of 350° C. also has an advantageous effect on the efficiency of embedded garnet phosphors. This is also true if the application is performed on the chip, since it can be damaged at higher temperatures. If the layers are condensed at different temperatures, it is advantageous if the first layer is condensed at the highest temperature and the temperature then decreases with each further layer.

Since the metal phosphate matrix cleaves off water and/or carbonaceous components during the temperature treatment and its structure cross-links increasingly at the same time, the two layers do not mix, even if the matrices have the same composition and were condensed at the same temperature. The maximum condensation temperature to be applied Ta (max) is provided by the temperature resistance of the phosphor powder to be embedded and by that of the substrates onto which they are applied. The minimum required condensation temperature Ta (min) is dependent on the composition of the matrix, which must be condensed at least to a large enough extent that a certain weather resistance is provided. This condensation is preferably carried out at temperatures of 200-550° C., in particular 200-350° C. It is advantageous if the condensation temperature is greater than the later usage temperature, to obtain a certain temperature stability and optical stability.

Such embedding enables the achievement of various colorimetric loci without having to produce appropriate phosphor mixtures beforehand. The colorimetric locus is rather controlled via the concentration and/or the layer thickness of the at least two layers. Optionally, each suspension having such a metal phosphate solution can additionally also be admixed with solids in powdered form (nanoparticles, scattering particles, glass powder) and/or solutions of other soluble metal salts.

Finally, the invention relates to conversion elements (both of the CLC type and also of the remote type) having at least two layers of inorganic matrix, in each of which at least one phosphor type is embedded in powder form. The second layer is arranged vertically or horizontally in relation to the first layer. The remission is thus reduced and the colorimetric locus can thus be activated better in a targeted manner at the same time. The invention can also be used for conversion elements of the RGB type, for example. In this case, the primary radiation is UV, three phosphors are used for the conversion, the peak emission of which lies in the blue, green, and red spectral ranges. The three phosphor powders can be housed in separate layers made of condensed metal phosphate, or two of the three phosphor powders can be embedded together in one layer made of condensed metal phosphate. In one special embodiment, the blue component is not generated by conversion, but rather by a blue-emitting chip or laser. In this case, only two further phosphors are still required for RGB.

Optionally, further particles (nanopowders, scattering agents, glass powders, etc.) can also be added to each matrix solution.

It is to be noted in this case that the various properties of a condensed metal phosphate are achieved in that its composition—in the example for aluminum phosphate, it is essentially the Al2O3-P2O5-H2O ratio—and the degree of cross-linking during the temperature treatment can be adapted to the respective phosphor. However, properties such as transparency, turbidity, and opacity are thus also variable.

In principle, the metal phosphate can also contain glassy or ceramic fillers, which do not also melt. The proportion of phosphor powder, optionally having filler, can be so high that the condensed metal phosphate more or less only functions as a binding agent/adhesive, which holds together the particles, similarly to a ceramic adhesive. Depending on the usage and requirement, functional components can be added to the metal phosphate solution.

The coefficient of thermal expansion of the condensed metal phosphate is preferably at least $5.0 \times 10^{-6}$/K. In the case of the use of different compositions, it is to be ensured that the coefficients of thermal expansion of the various metal phosphates do not deviate excessively from one another (preferably at most 5 to 10%).

In a special embodiment, the condensed metal phosphate contains, as the main component, phosphate, which can be provided in various modifications, i.e., as an orthophosphate, triphosphate, metaphosphate, polyphosphate, ultraphosphate, and also in all possible intermediate stages.

Concrete exemplary embodiments for the production of such layers are also to be explained in greater detail hereafter.

EXAMPLE 1

Phosphor, for example, YAG:Ce, in powder form is suspended in an aqueous solution of a metal phosphate, for example, aluminum monophosphate $Al(H_2PO_4)_3$ (for example, 50 wt.-% FFB716 from Budenheim dissolved in water). The mixture ratio is approximately 1:1 in relation to the weight. The suspension is applied to a substrate, for example, a glass substrate, as a layer which is approximately 50 μm thick. The drying is subsequently performed at low temperatures (≤150° C.), optionally in addition at reduced ambient pressure. The condensation is performed in oxidizing atmosphere in the temperature range of 150-800° C., preferably 300-550° C., for a few seconds up to one hour. The pure aluminum monophosphate solution displays the following stages in the DTA (differential thermoanalysis) after drying at <100° C.: above 250° C., the triphosphate $(AlH_2P_3O_{10})$ arises and above 500° C., aluminum metaphosphate $(Al(PO_3)_3)$ or long chain and ring-shaped aluminum polyphosphates $[Al(PO_3)_3]_n$ arise. In combination with the phosphor YAG:Ce, the reactions are shifted toward lower temperatures. The condensation reactions and products can be influenced by glass-forming additives in the aluminum monophosphate solution, for example, additives containing zinc, magnesium, or boron.

The first, already condensed layer is now coated using a second layer, which contains a second phosphor in powder form, for example, a nitride, and is treated similarly to the first conversion layer. In the conversion element thus produced, the two layers lie on top of another (see FIG. 2).

EXAMPLE 2

A chip surface is coated using phosphor powder, for example, LuAG:Ce. The powder layer is then spray coated using an aqueous solution of a metal phosphate according to Example 1. The drying is subsequently performed at low temperatures (≤150° C.), optionally additionally at reduced ambient pressure. The condensation is performed in oxidizing atmosphere in the temperature range of 200-350° C. for a few seconds up to one hour. The first, already condensed layer is now coated using a second phosphor powder, for example, a nitride. This powder layer is spray coated using an aqueous solution of a metal phosphate, for example, aluminum monophosphate $Al(H_2PO_4)_3$, which additionally also contains other phosphates, for example, Mg and/or Zn. The drying is subsequently performed at low temperatures (≤150° C.), optionally additionally at reduced ambient pressure. The condensation is performed in oxidizing atmosphere in the temperature range of 200-350° C. for a few seconds up to one hour.

EXAMPLE 3

A suspension, consisting of garnet phosphor powder and, for example, an aqueous aluminum monophosphate solution according to Example 1, is applied as a web to a circular-surface highly reflective substrate (aluminum as is typically used in the light application), and then dried and condensed according to Example 2. Before the coating, the substrate can be irradiated using UV for better wetting. A further suspension is applied as a web adjoining the narrow side of this web. It consists of an aqueous solution of a metal phosphate, for example, aluminum monophosphate $Al(H_2PO_4)_3$, which additionally also contains other phosphates or oxides, for example, Mg and/or Zn and/or B, and another phosphor powder, for example, a nitride. This layer is dried and condensed according to Example 2. In this manner, for example, color wheels for laser applications may also be produced, which are described in greater detail in the contemporaneous German patent application having the official reference number 10 2012 210195.0.

In a similar manner and in various combinations, other substrates having vertical and horizontal coatings may also be produced.

The solid content of phosphor in the matrix can be varied depending on the desired colorimetric locus of the LED. In this case, it is also possible to produce conversion elements which convert 100% of the light emitted by the chip. In this case, the solid content of phosphor is so high that the metal phosphate used only encloses the phosphor particles with a thin layer and thus glues them to one another. The latter is restricted to the use of, for example, RGB (see FIG. 4).

Optionally, solids in powder form and/or solutions of other soluble metal salts can also be added to the suspensions according to the examples. Solids are preferably nanopowders, for example, pyrogenic silicic acid (for example, Aerosil from Evonik) and/or pyrogenic $Al_2O_3$ (for example, Aeroxid Alu C from Evonik) and/or pyrogenic $TiO_2$ (for example, Aeroperl P25 from Evonik), which are then also enclosed by the matrix. The coefficient of expansion can also be set, inter alia, by way of these particles, but materials having negative coefficients of expansion, for example, β-eucryptite, can also be used for this purpose. It is also possible to add a ground soft glass, hard glass, or quartz glass and also a glass solder. An addition of another soluble metal salt to the suspension is, for example, the addition of an aqueous solution of yttrium acetate or yttrium phosphate. In this case, the components react with one another and the metal phosphate is thus modified. Components which change, preferably increase, the index of refraction, such as yttrium oxide or tellurium oxide, can also be added as soluble metal salts or as oxidic particles.

The term phosphate explicitly comprises here in particular monophosphate, such as water-soluble $Al(H_2PO_4)_3$ and also water-insoluble polyphosphate such as $[Al(PO_3)_3]_n$. Depending on the processing, metaphosphate such as $(Al(PO_3)_3)$ or also tertiary phosphate such as $AlPO_4$ may arise in this case. One stopping point is a molar ratio of the phosphor to the metal, in particular aluminum, of P/Al=1 to 10, limit values included.

For the case in which the conversion element is to be spaced apart from the chip (remote phosphor solution), instead of the chip, a transparent substrate, for example, glass having a high transmission in the visible spectrum, is coated (see Example 1). The side coated with the phosphor preferably faces toward the chip.

The invention relates in particular to high-performance LEDs having a power of at least 5 W, in particular at least 10 W connected power. The advantages of such an inorganic matrix of the conversion element fully come to bear here, since the inorganic matrix is clearly more thermally stable and has better heat conduction, in comparison to an organic matrix, and therefore less damage occurs with long service life. In comparison to a matrix made of glass, which was produced via a melting process of the batch raw materials, the phosphor powder, with identical composition of the matrix, can be embedded at lower temperatures if the matrix was produced from a condensed metal phosphate solution. As already mentioned, this results in less damage to the phosphor during the embedding.

Above all in the case of red-emitting phosphors, good heat conduction of the matrix of the conversion element plays an essential role because of the large Stokes shift in relation to the primary radiation. In this case, the waste heat must be conducted efficiently away from the phosphor, to protect it against degradation during operation.

The amorphous or predominantly amorphous metal phosphates, which were produced via condensation, cannot be differentiated with respect to structure from those which were produced from the melt of a batch, unless a glass having the corresponding amorphous components cannot be produced in this context via this pathway. However, different behavior is displayed during the embedding of the phosphor powder. While glasses become less and less viscous with increasing temperature, the viscosity of the metal phosphate solutions rises with increasing temperature. This behavior is to be attributed to the fact that more and more water or carbonaceous reaction products are cleaved off with increasing temperature, which results in increasing cross-linking of the matrix. This layer thus does not soften again with identical temperature treatment, because of which, for a multilayer conversion element, the same matrix and condensation temperature can be used for the various layers, without the layers mixing. In the case of an amorphous or predominantly amorphous glass matrix, which was produced from the melt of a batch, this would result in mixing, at least in the region of the interfaces, since both layers soften again.

Various exemplary embodiments of a multilayered conversion element may thus advantageously be implemented. As an example, this will be explained with two phosphors, which are layered one on top of another (vertical array). However, this also applies similarly to horizontal, latticed, or strip-type array.

In a first embodiment, the same metal phosphate solution is used in this case for the matrix. As already mentioned, coating can be performed directly, whereby a separate adhesive is not required for the bonding of the two parts. Due to the direct bonding, there is also no refraction difference or deviating thermal behavior caused by the adhesive. In contrast thereto, ceramic plates must always be glued on separately, which is complex, on the one hand, and problematic with regard to the thermal stability, on the other hand.

Organic matrices are not usable in any case in the event of high LED power because of the lack of thermal stability. However, glasses as matrices are also problematic, since during the application of the second layer, the first layer is always also softened again if the same glass is used. Because of the contrary behavior of condensed metal phosphates in relation to molten glasses, they are therefore ideally suitable for vertical, but not for horizontal coatings.

In a further exemplary embodiment, a metal phosphate can also be custom tailored for one phosphor in each case. This is not possible in the case of the introduction of multiple phosphors into a single matrix, in this case a compromise must always be found in the selection of the metal phosphate. However, it is possible in the case of a custom-tailored solution to perform a targeted adaptation.

Orientation points for an adaptation are, for example, the pH value of a solution of the metal phosphate. This is dependent, inter alia, on the phosphate content and is usually in a range between 1 and 7. The phosphors to be introduced are differently sensitive in relation to stress by acid milieu. Orthosilicates are particularly strongly sensitive, garnets and nitrides are less sensitive. Other phosphors usually lie between these extremes.

A second important aspect is the curing temperature Ta of the metal phosphate, or also the temperature at which the metal phosphate in combination with the phosphor and optionally other additives condenses, and polymer phosphates form. At this temperature Ta, the cleavage of water is completed or essentially completed. For many nitridic phosphors, a Ta of at most 350° C. is recommended, since these phosphors, in particular red-emitting nitridic phosphors of the type M2Si5N8:Eu or calsin variants, are relatively temperature-sensitive.

For garnet phosphors such as YAG:Ce, YAGAG, or LuAGAG, a metal phosphate is recommended, using which a Ta of at most 400° C. results.

In general, however, a metal phosphate should be applied, which enables the lowest possible Ta, since this procedure substantially protects every phosphor. A limit value in this sense is an upper limit of the Ta of 350° C.

An amorphous or predominantly amorphous, transparent, and colorless matrix made of aluminum phosphate has proven to be particularly suitable, which forms by way of condensation at elevated temperature from an aluminum monophosphate solution. In particular oxidation-sensitive phosphors, for example, nitrides, displayed no noticeable efficiency loss after the embedding in such matrices at temperatures ≤350° C. Moisture tests of such samples have had the result that these matrices react neutrally and thus indicate good setting and chemical resistance. The required temperature Ta for the setting reaction can be reduced still further if other metal phosphates or oxides, e.g., Zn, Mg, and/or B are contained in the solution. These are, for example, condensation temperatures Ta between 200-300° C., which therefore lie in a temperature range of interest, to also be able to coat temperature-sensitive substrates or embed temperature-sensitive materials.

Typical layer thicknesses of the individual layers of the conversion element are 10 to 200 μm, depending on the grain size distribution of the embedded phosphor powder, the mixing ratio of solid to matrix, and the desired degree of conversion. In this case, first layer and second layer do not necessarily have to be of equal thickness. For a partial conversion of blue light to warm-white light, a mixing ratio of 1:9 weight parts generally results for red to green/yellow, depending on the density and efficiency of the phosphors and on the emission spectra.

The custom-tailored efficiency achievable using various phosphors is therefore also dependent on the condensation temperature ("firing temperature"). Garnets are generally less sensitive in this case than nitridic phosphors such as nitridosilicates or calsins. With careful treatment, however, nitridic phosphors hardly have deficiencies, the efficiency loss is a few percent in relation to the starting powder. This is true in particular for a matrix based on aluminum monophosphate, which was subjected to a "firing temperature" of 200 to 350° C.

A matrix based on aluminum monophosphate having a "firing temperature" of 200 to 350° C. is also a good candidate for the embedding of garnet phosphors. Since these phosphors are less temperature-sensitive, the "firing temperature" can be up to 400° C. in this case. The efficiency loss in relation to the starting powder can then also be restricted to a few percent here.

It is therefore possible to use two different matrices for the two phosphors and also to cure the same matrix at different "firing temperatures". It is also possible to use the same matrix and "firing temperature" for both layers. Simultaneous curing of the various layers is also conceivable, if the "firing temperature" of the layers is equal. In this case, the first layer is only dried or is pre-condensed at lower temperature.

In a special embodiment, the same phosphor can also be embedded in two different matrices, for example, to adapt the index of refraction or the coefficient of expansion or scattering properties step-by-step.

A special advantage of the invention described here is that conversion elements can thus also be produced by embedding phosphor powders, which are not producible or are only producible complexly as a ceramic. Such a conversion ceramic could also be coated in this manner with at least one further conversion layer. In comparison to the embedding of phosphor powder in glass, which was produced via a melt from the batch raw materials, the process described here is also significantly simpler and more cost-effective and can optionally be combined therewith.

Typical grain size distributions of the phosphor powder are a D50 between 5-50 μm, in particular 5-30 μm. The mixing ratio of solution to solid is grain-size dependent. The finer the grain, the more matrix solution is required. For garnet phosphors having a grain size distribution of a D50 between 5-30 μm, a mixing ratio of phosphor:matrix solution of 1:0.5-3.0 (weight) has proven itself. No further powder is added in this case.

The concentration of the metal phosphate solution is typically between 5-60 wt.-%, ideally 40-60 wt.-%. The condensed matrix preferably has few pores.

The conversion element forms an at least two-layer converter.

The metal phosphate matrix is formed by condensation of a metal phosphate solution (chemical setting). The metal phosphate is preferably colorless and predominantly amorphous, i.e., up to greater than 50%. In addition to Al2O3, for example, it can also contain Y2O3.

The invention is not restricted by the description on the basis of the exemplary embodiments relating thereto, but rather comprises any novel feature or any combination of features which are contained in the patent claims, even if this feature or this combination is not explicitly specified in the patent claims or exemplary embodiments.

The invention claimed is:

1. An optoelectronic semiconductor component having a light source, which emits primary radiation, a housing, and electrical terminals, wherein a conversion element, which comprises at least two phosphor powders, is connected upstream of the optoelectronic semiconductor component, wherein the phosphor powders partially or completely convert primary radiation, and wherein at least one first phosphor powder of said at least two powders is embedded and fixed in a first inorganic matrix comprising a first metal phosphate, and at least one second phosphor powder of said at least two powders is embedded and fixed in a second matrix comprising a second metal phosphate.

2. The optoelectronic semiconductor component as claimed in claim 1, wherein the first matrix and the second matrix are layers, and wherein the second matrix layer is arranged above or adjacent to the first matrix layer.

3. The optoelectronic semiconductor component as claimed in claim 2, wherein the first matrix layer to which he first phosphor powder is applied and further matrix layers to which phosphor powders are applied follow one another directly without mixing, wherein these matrix layers are either bonded to the semiconductor component or are spaced apart therefrom.

4. The optoelectronic semiconductor component as claimed in claim 1, wherein each of the first and second metal phosphates is essentially alkali-free and halogen-free.

5. The optoelectronic semiconductor component as claimed in claim 4, wherein each of the first and second metal phosphates contains at most 1 mol-% alkali oxides and halogenated components.

6. The optoelectronic semiconductor component as claimed in claim 4, wherein each of the first and second metal phosphates contains 5 to 90 mol-% $P_2O_5$.

7. The optoelectronic semiconductor component as claimed in claim 4, wherein each of the first and second metal phosphates contains 50 to 90 mol-% $P_2O_5$.

8. The optoelectronic semiconductor component as claimed in claim 4, wherein the matrix of at least one layer is produced from a different metal phosphate than the other conversion layers.

9. The optoelectronic semiconductor component as claimed in claim 8, wherein the metal phosphate matrices are adapted to the respective embedded phosphor powders.

10. The optoelectronic semiconductor component as claimed in claim 4, wherein each of the first and second metal phosphates contains 10 to 90 mol-% $Al_2O_3$.

11. The optoelectronic semiconductor component as claimed in claim 4, wherein each of the first and second metal phosphates contains 10 to 50 mol-% $Al_2O_3$.

12. The optoelectronic semiconductor component as claimed in claim 1, wherein each of the first and second metal phosphates is essentially transparent in the visible spectral range.

13. The optoelectronic semiconductor component as claimed in claim 1, wherein each of the first and second metal phosphates contains phosphate as a main component.

14. The optoelectronic semiconductor component as claimed in claim 13, wherein each of the first and second metal phosphates is or predominantly contains aluminum phosphate.

15. The optoelectronic semiconductor component as claimed in claim 14, wherein each of the first and second metal phosphates contains more than 50 wt.-% aluminum phosphate.

16. The optoelectronic semiconductor component as claimed in claim 1, wherein inorganic components are added to each of the first and second metal phosphates, which increase the index of refraction and/or are used as fillers and/or act as optical filters and/or scatter and/or increase the heat dissipation and/or adapt the thermal expansion behavior to the substrate.

17. The optoelectronic semiconductor component as claimed in claim 1, wherein at least one of the first and second metal phosphates has, in combination with the associated phosphor powder, a curing temperature of at most 400° C.

18. The optoelectronic semiconductor component as claimed in claim 17, wherein at least one of the first and second metal phosphates has, in combination with the associated phosphor powder, a curing temperature of at most 300° C.

19. The optoelectronic semiconductor component as claimed in claim 17, wherein at least one of the first and second metal phosphates has, in combination with the associated phosphor powder, a curing temperature of at most 220° C.

20. The optoelectronic semiconductor component as claimed in claim 1, wherein at least one of the first and second metal phosphates has a pH value of 1 to 7 as a solution.

* * * * *